United States Patent [19]

Chen

[11] Patent Number: 5,789,117
[45] Date of Patent: Aug. 4, 1998

[54] TRANSFER METHOD FOR NON-CRITICAL PHOTORESIST PATTERNS

[75] Inventor: Yung-Dar Chen, Hsin-chu, Taiwan

[73] Assignee: Taiwan Semiconductor Manufacturing Company, Ltd., Hsin-Chu, Taiwan

[21] Appl. No.: 758,418

[22] Filed: Dec. 2, 1996

[51] Int. Cl.$^6$ ........................................ G03F 9/00
[52] U.S. Cl. ................................................ 430/5
[58] Field of Search .................. 430/5, 322, 324, 430/325

[56] References Cited

U.S. PATENT DOCUMENTS 5,429,897  7/1995  Yoshioka et al. ...................... 430/5
5,482,799  1/1996  Isao et al. ............................... 430/5
5,506,080  4/1996  Adair et al. ............................ 430/5
5,514,498  5/1996  Nakagawa .............................. 430/5
5,556,724  9/1996  Tarumoto et al. ..................... 430/5

Primary Examiner—S. Rosasco
Attorney, Agent, or Firm—George O. Saile; Stephen B. Ackerman

[57] ABSTRACT

A method of direct transfer printing of a photoresist pattern layer onto the first pattern layer of a phase shift photomask reticle is described which allows completion of the photomask pattern at a much lower cost than the conventional multiple-pass photolithographic process. The direct transfer of the resist pattern from printing plate to mask surface by means of a platen is especially suitable for non-critical regions such as border regions, seal bands, identification marks, and the like.

12 Claims, 7 Drawing Sheets

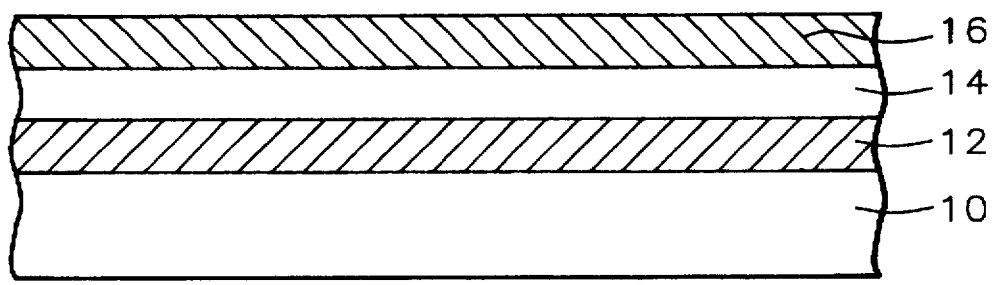
*FIG. 1a - Prior Art*
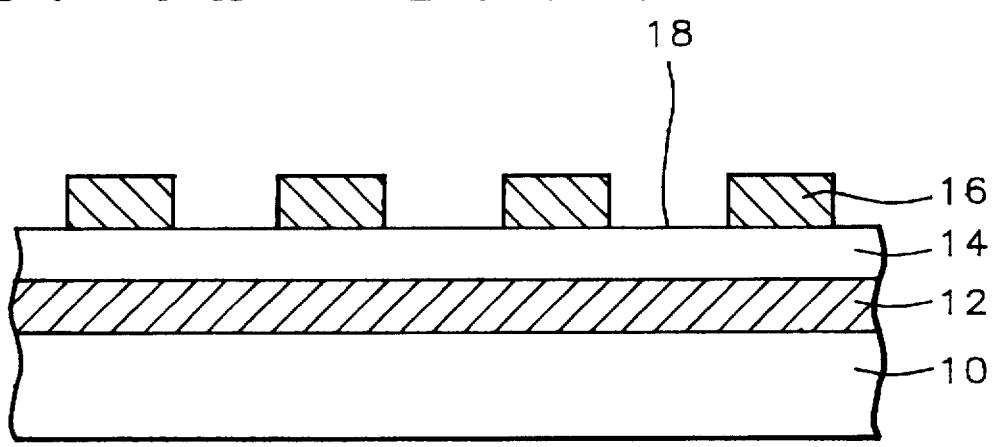
*FIG. 1b - Prior Art*
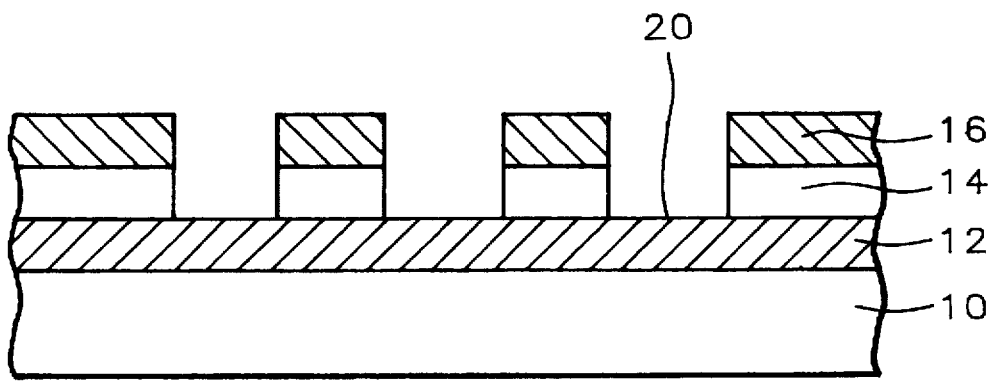
*FIG. 1c - Prior Art*

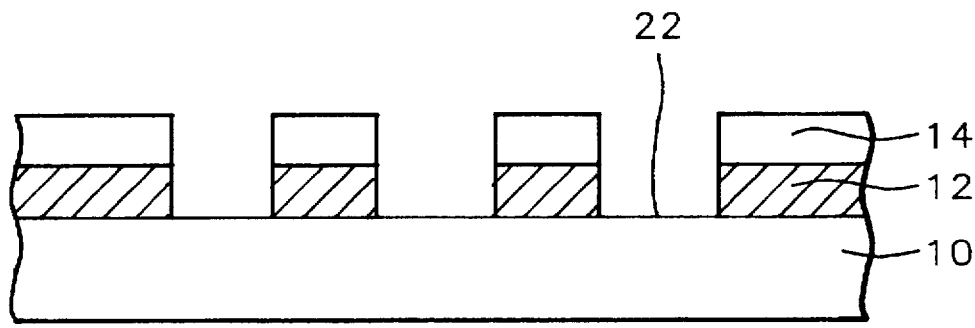
*FIG. 1d - Prior Art*
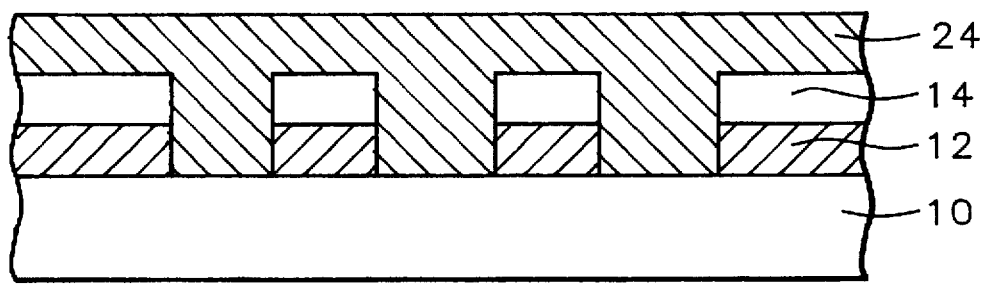
*FIG. 1e - Prior Art*
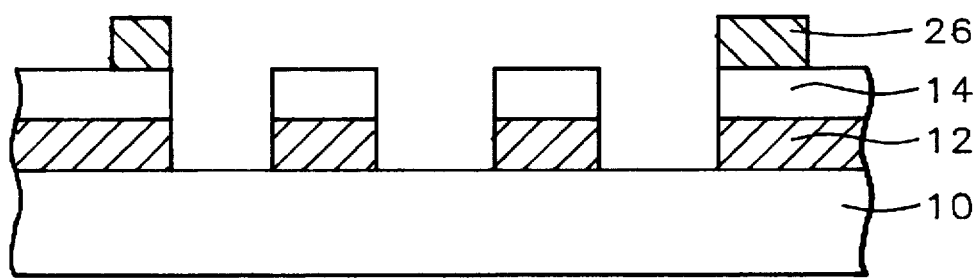
*FIG. 1f - Prior Art*

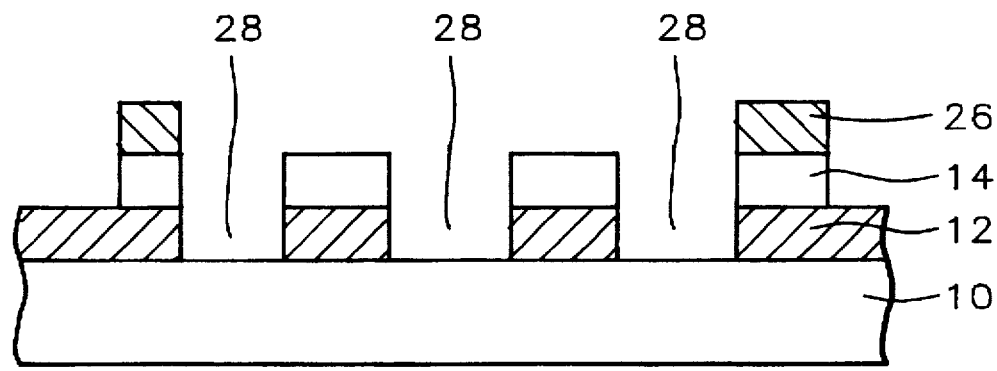
*FIG. 1g — Prior Art*
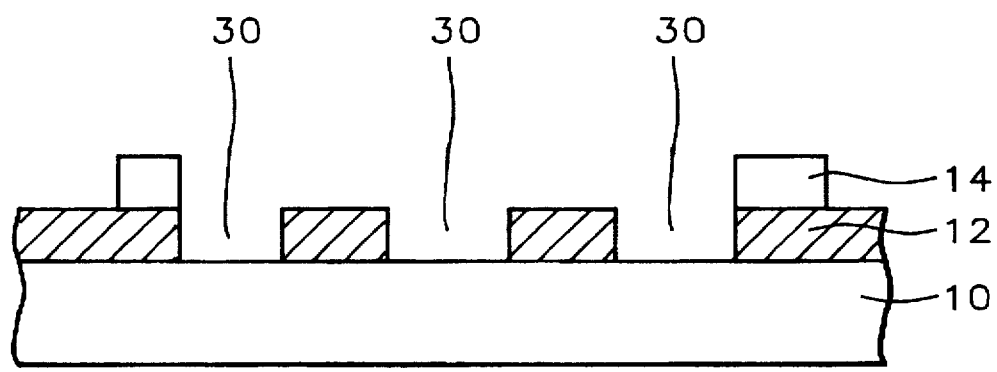
*FIG. 1h — Prior Art*

TRANSFER METHOD FOR NON-CRITICAL PHOTORESIST PATTERNS

BACKGROUND OF THE INVENTION

(1) Field of the Invention

This invention relates to the fabrication of photomask patterns for projection printing in integrated circuit manufacture. In particular, it relates to an economical method for forming non-critical portions of the pattern such as peripheral or border rings on photomasks for projection printing such that adjacent portions of the pattern cause phase shifting of the exposing light to occur, leading to improved quality in the projected image and the subsequent pattern formed therefrom.

(2) Description of the Related Art

The fabrication of electronic devices known as semiconductor integrated circuits is accomplished by repetitive engraving of very fine-dimensioned patterns on the surface of the semiconductor body and surface layers deposited thereon. These patterns constitute the various active elements, passive components, interconnections, and the like which in their totality make up the integrated circuit device. The engraving of such patterns is accomplished by using templates or stencils of the desired patterns called photomasks, and transferring them to the surface of the integrated circuit by means of light transmitted through the various opaque and transparent regions of the photomask, which exposes a corresponding pattern in a photosensitive material coated on the surface. Upon suitable chemical treatment of the exposed material, the exposed pattern is developed and the pattern can then be transferred again through the photosensitive material or resist by chemical or physical means, hence engraving the pattern in the material. The resist pattern is then removed, and a new sequence of operations to form the next pattern is begun. The entire sequence of operations for forming such finely-dimensioned patterns is referred to as microlithography, a subset of the well-known process known as photolithography.

In the utilization of photomasks for pattern generation by microlithography for integrated circuit fabrication, the dimensions have become so fine that it has become necessary to go beyond direct 1:1 replication methods: i.e. the direct contact print transfer of the photomask pattern to the photoresist on the surface of the layer to be patterned. In order to produce patterns whose linewidths and spaces are of the order of one micron, it has become customary to resort to projection printing. In this method, the desired pattern is optically imaged on the surface at a demagnification of about 10:1 such that the image to be printed on the surface is about ten times reduced in size from the original. This method requires refined optical techniques such as monochromatic and preferably coherent exposure radiation as well as the highest quality lenses, etc. In order to cover the entire surface of the semiconductor substrate with multiple images to fabricate multiple devices thereon, the original 10x pattern, which is known as a reticle, is focused repeatedly on adjacent regions of the surface and the pattern repeatedly exposed. This is done by stepping or moving either the surface or the focused image, usually the former, between exposures. Thus the method is generally known as step- and -repeat pattern microlithography. The various methods and techniques for accurate and precise location of the several successive pattern images on the same device location required to fabricate an integrated circuit device have been refined to the extent that fundamental properties of optical behavior are becoming the limiting factor in hindering further improvement. For example, the phenomenon of interference between adjacent trains of light waves becomes noticeable between two closely-spaced areas adjacent to each other on the photomask pattern which are simultaneously exposed.

Imaging of optical photolithographic masks is greatly limited by diffraction effects when the minimum feature size is decreased to about one micron or less in the image, which corresponds to about ten microns or less in the 10X photomask reticle. The edges of pattern apertures or openings act as virtual sources of light and cause it to spread into the dark regions. The resulting image has greatly reduced contrast and the dark regions at the edges exhibit fringes of alternating light and dark bands due to diffraction effects. The resolution limit between adjacent illuminated portions of the projected image due to this effect is about one micron in practice, hence linewidths and spacings of this order cannot be achieved with conventional photomask reticles and optical exposure equipment.

A significant improvement in image resolution and contrast may be obtained by recourse to phase-shifting photomasks. In this technique, light from a monochromatic and at least partially coherent source is transmitted through adjacent aperture regions on the photomask pattern which are 180 degrees out of phase with each other. Hence the image projected exhibits a distinct improvement in contrast and resolution because the phase reversal of the electric field vector of the light causes destructive rather than constructive interference to occur at the edges of the adjacent exposure regions. In order that only the phase is affected and not the light intensity itself so that the overall exposure is unaffected, the phase reversal is accomplished by causing adjacent portions of the photomask pattern to be made with a thickness of a transparent material which is a multiple of the wavelength of the monochromatic radiation used in the exposure. For example, if the exposure radiation wavelength were 0.4 microns, which is at the blue end of the visible spectrum, then appropriate thicknesses of the phase-shifting portions of the pattern would be 0.8 microns, 1.2 microns, etc. It is desirable to avoid any loss of transmitted radiation to use as small a multiple thickness as practicable To accomplish this improvement, the phase shift mask (PSM) photomask pattern concept has been developed. This is illustrated in FIGS. 1a–1h, which depicts a series of cross-sectional views of the fabrication of a PSM reticle. In essence, adjacent clear areas which are to be exposed are treated as half-tone regions wherein alternating regions are coated with a transparent layer whose thickness is a small multiple n of the light wavelength $\lambda$ used for exposing the focused image into the photoresist layer. The phase difference $n\lambda$ results in the negation of fringe effects due to constructive interference. The phase-shifting layer is thus a subset of the pattern to be used at that particular level in the fabrication sequence. In an analogy to a method of printing images with dark spots on a light background, this method is sometimes referred to as a half-tone process. The conventional method of fabrication of such a PSM reticle involves two separate exposure and development sequences, as shown in FIGS. 1a–1h. This is expensive due to the time and processing involved, and due to the yield losses due to alignment errors etc. Various methods of fabrication of PSM reticles are discussed by Nagakawa in U.S. Pat. No. 5,514, 498, and by Tarumoto et al in U.S. Pat. No. 5,556,724, all involving multiple processes of photolithographic fabrication involving exposure and development of photoresist patterns and subtractive etching of patterns.

An alternate method of producing PSM reticles which produces the effect of half-tone processing, i.e. alternating regions of transmission of different optical thickness, is to produce the second pattern by a non-photolithographic process. Such processes as direct transfer of a material pattern by printing have been discussed for such purposes as mask repair by Adair et al in U.S. Pat. No. 5,506,080, but not with respect to the formation of a pattern subset for the purpose of phase alteration or shifting of transmitted light.

SUMMARY OF THE INVENTION

It is an object of the invention to provide a process for the fabrication of phase shift photomasks used in the manufacture of semiconductor integrated circuits in which only one photolithographic sequence is required. It is a further object to describe a method for pattern formation of a second layer of a phase shift photomask pattern which uses direct transfer printing of the resist mask. Still another object of the invention is to describe a phase shift photomask reticle in which the pattern is completed by fabricating non-critical second parts by means of a directly-printed resist mask for etching of the pattern. In accordance with the objects of the invention, a method of direct transfer printing of a photoresist layer onto the first pattern layer of a phase shift photomask is provided which allows completion of the photomask at much lower cost than the conventional two-fold photolithographic process. It is particularly suitable for non-critical regions of the pattern such as peripheral borders, seal bands, identification marks, and the like.

BRIEF DESCRIPTION OF THE DRAWINGS

FIGS. 1a–1h is a set of schematic cross-sectional drawings which depict the formation of a phase shift photomask by the prior art.

DESCRIPTION OF THE PREFERRED EMBODIMENT

Figure 2A:
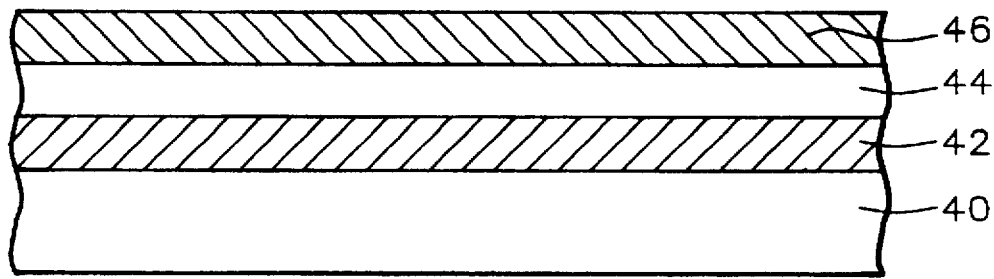
FIGS. 2a–2g is a set of schematic cross-sectional drawings depicting the sequence of steps in the fabrication of a phase shift photomask by the current invention.
Figure 2B:
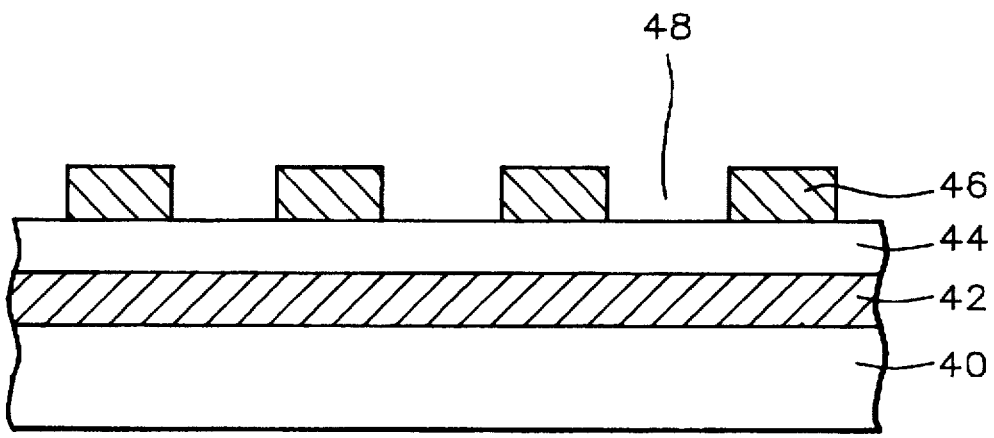
Figure 2C:
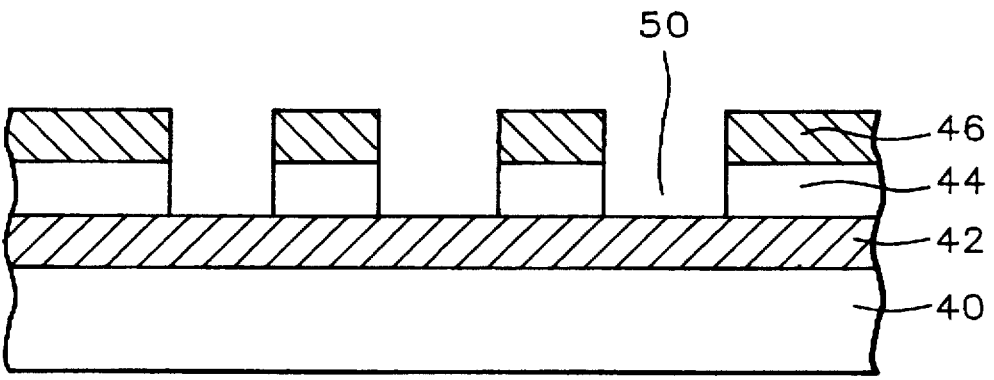
Figure 2D:
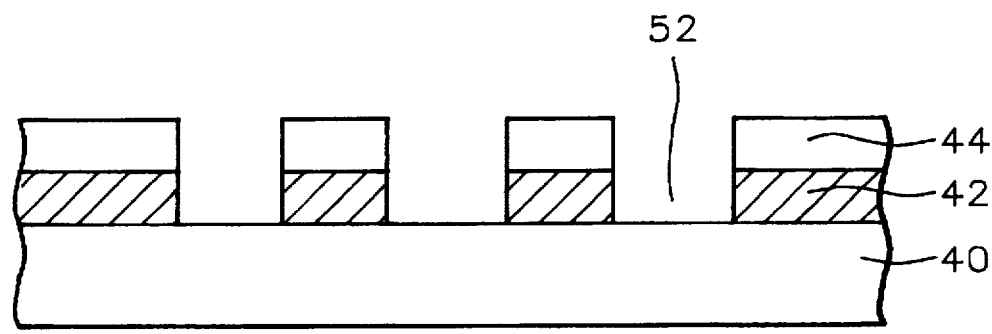
Figure 2E:
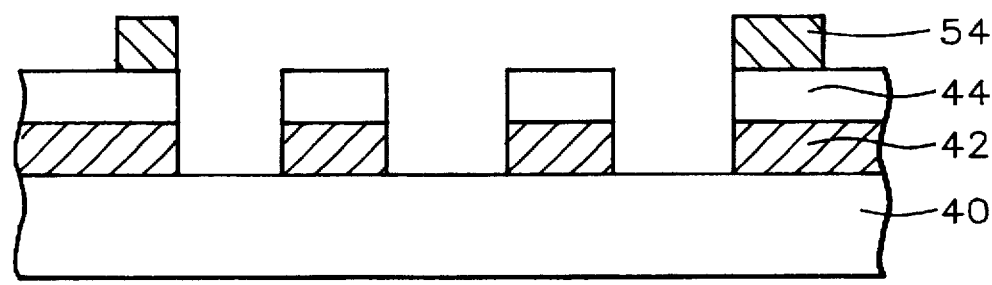
Figure 2F:
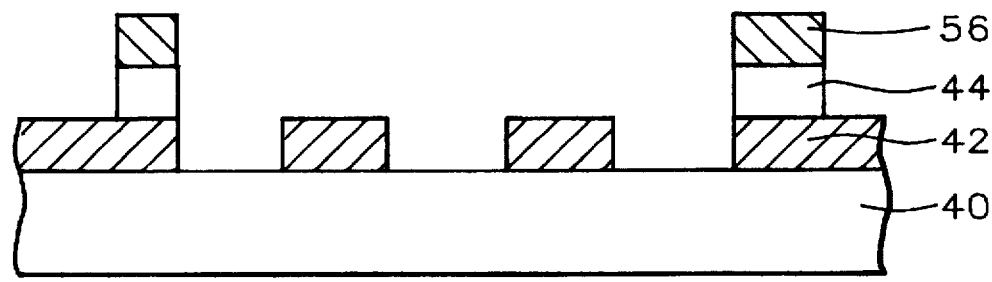
Figure 2G:
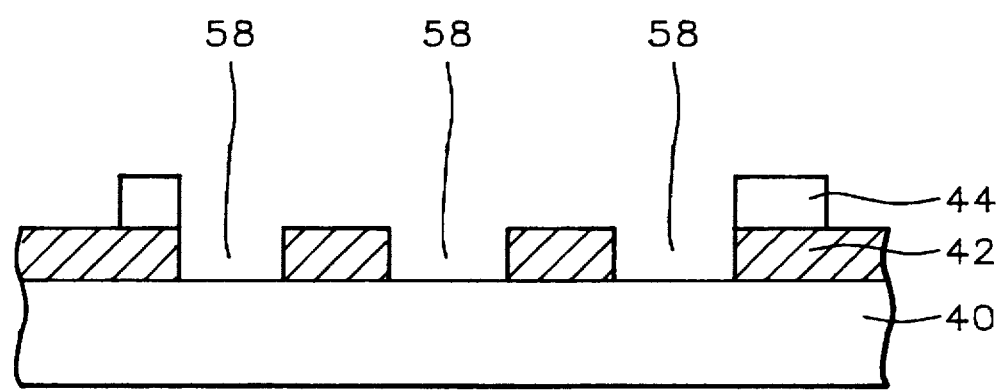

Referring now more particularly to FIGS. 1a–1h, there is shown a typical fabrication sequence in the fabrication of a phase shift photomask in the prior art. A transparent substrate 10 is coated with a transparent layer of molybdenum silicon oxynitride MoSiON 12, a layer of chromium and chromium oxide Cr and CrO2 14, and a layer of photoresist 16. It is then exposed and developed to form the photoresist pattern 18 which is then transferred to the Cr+CrO2 layer 20 by etching, and then to the MoSiON layer 22 by dry etching. After removal of the photoresist layer, the resulting pattern is coated with photoresist 24 for a second set of photolithographic operations. These form a second pattern 26 by exposure, development, and etching 28. Upon removal of the photoresist stencil, the final phase shift photomask pattern 30 is completed, the desired half-tone effect having been achieved. There are many minor variations on the basic fabrication sequence shown in FIG. 1, but they all have in common the use of two or more separate expose-develop-etch photolithographic cycles to form the complete mask pattern. The current mask fabrication technology utilizes an electron-beam exposure system, which is a complex and costly method of accomplishing the exposure step. In addition, the second set of development, etching, and stripping operations act as detractors of the final yield of useful photomasks.

Referring now more particularly to FIGS. 2a–2g, there is shown a set of schematic cross-sectional diagrams which depict the fabrication of a phase shift mask reticle by the method of the invention. The process starts with a transparent substrate 40 coated with a layer of MoSiON 42, Cr and CrO2 44, and photoresist 46 as shown previously. The first set of photolithographic operations serve to expose and develop the resist pattern 48 and etch the pattern in the Cr+CrO2 layer 50 and the MoSiON layer 52. Then a layer of photoresist 54 is printed by a direct transfer process onto the surface of the photomask. Subsequently, this directly-printed photoresist layer acts as the mask during etching of the Cr+CrO2 layer 56. Finally, after stripping of the resist mask 54 the completed phase transfer mask pattern 58 is produced. The process described does not require a second photoresist exposure and development sequence to produce the half-tone effect desired for the phase shift mask. The photoresist pattern printing process may be repeated as often as desired if it is more efficient to break the printed pattern into two or more portions.

Figure 3A:
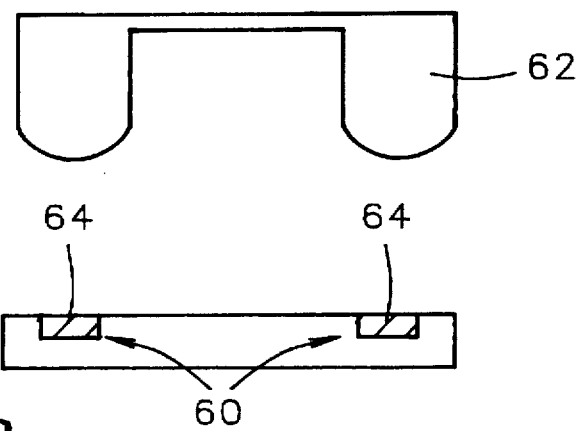
FIGS. 3a–3c is a schematic drawing of the direct transfer printing process used to form the second layer of the phase shift photomask of the current invention.
Figure 3B:
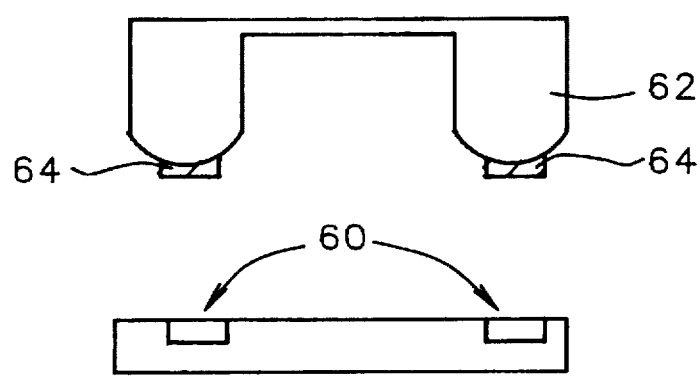
Figure 3C:
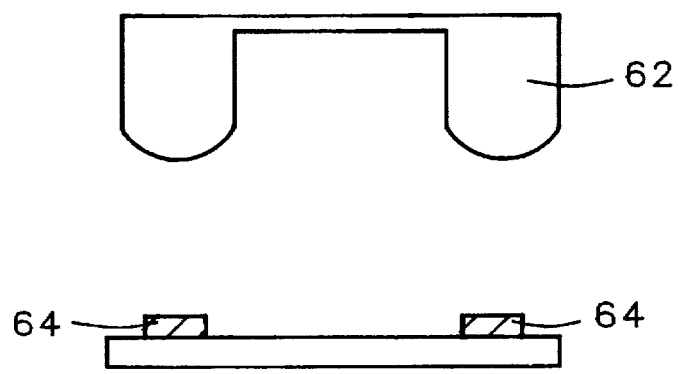

Referring now more particularly to FIGS. 3a–3c, the method of direct transfer printing of the photoresist layer is schematically illustrated. The photoresist to be printed is contained on a printing plate in a pattern depression 60, and is picked up by a transfer plate or platen 62. It is then carried to the surface where it is to be printed and deposited thereon as the desired pattern of photoresist 64. The simplicity of the method lends to an economical high-yield fabrication process for phase shift mask reticles, since they are 10× the size of the final projected image and do not require the fine accuracy of image and alignment of the final image. It is particularly suited to forming portions of the pattern which are non-critical with respect to absolute accuracy of shape, placement, or alignment with other portions of the pattern. Thus, regions such as peripheral bands for sealing or clear areas outside actual device areas can readily be produced by the direct transfer printing method. Although the direct transfer printing method schematically depicted herein by platen is a preferred method, it will be readily seen that other forms of direct transfer printing such as web transfer, preformed patterns on carriers, and other refinements of the printing art are possible.

The photomask reticle described herein derives its phase-shifting properties by the presence of a layer of transparent molybdenum silicon oxynitride MoSiON on the transparent substrate and underlying the layer of opaque chromium and chromium oxide which will form the mask pattern. The thickness of the MoSiON layer must be carefully chosen so that it is an exact multiple of the wavelength of the monochromatic radiation which will be used in the subsequent exposure of photoresist through the photomask. The thickness can be expressed as n where n is an integer whose value must be at least 1, but is generally not more than 2 to 5 at the most, to minimize the loss of radiation intensity transmitted through the transparent layer.

While the invention has been particularly shown and described with reference to the preferred embodiments thereof, it will be understood by those skilled in the art that various changes in form and details may be made without departing from the spirit and scope of the invention.

What is claimed is:

1. A method in the fabrication of photomasks for the manufacture of semiconductor integrated circuits which allows optical phase-shifting properties to be produced in the photomask comprising:

providing a coated substrate;

generating a first portion, comprising a first coating and a second coating, of a photomask pattern;

forming a second resist pattern on the first portion of the photomask pattern layer by direct transfer;

etching away the exposed portions of the second coating; and stripping of the resist mask.

2. The method of claim 1 wherein said coated substrate comprises:

an optically transparent carrier plate;

the first coating formed on the transparent carrier plate, which comprises molybdenum silicon oxynitride; and the second coating formed on said first coating, which comprises chromium plus chromium oxide.

3. The method of claim 2 wherein said first coating of molybdenum silicon oxynitride is about $n\lambda$ microns in thickness, where n is an integer number between 1 and 5 and $\lambda$ is the wavelength of the exposing radiation.

4. The method of claim 2 wherein said generation of the first pattern portion is accomplished by:

electron beam exposure of photoresist;

development and etching of the layers of molybdenum silicon oxynitride and chromium/chromium oxide; and stripping of the resist mask.

5. The method of claim 1 wherein formation of said second resist pattern by direct transfer is accomplished by printing of said resist pattern layer on the surface of the first pattern layer.

6. A method for fabrication of phase shift photomask reticles for step-and repeat photolithography of semiconductor integrated circuits comprising:

forming a first pattern layers on a substrate coated with a layer of molybdenum silicon oxynitride and a layer of chromium plus chromium oxides by conventional photolithography using a photoresist pattern mask;

depositing a second resist pattern layer on the first pattern by direct transfer;

exposing and developing the second resist layer;

etching the exposed chromium/chromium oxide layer; and stripping the first photoresist pattern mask.

7. The method of claim 6 wherein said formation of first pattern layer is accomplished by:

exposing a photoresist layer by conventional photolithography;

developing the photoresist mask pattern;

etching of the underlying layers; and stripping of the photoresist mask.

8. The method of claim 6 wherein said deposition of resist is accomplished by direct transfer printing of the resist pattern from a printing plate to the surface of the mask pattern by means of a transfer platen.

9. A phase shift photomask reticle for step-and-repeat photolithographic processes used in fabrication of semiconductor integrated circuits comprising:

a transparent substrate coated with an opaque layer of chromium and chromium oxide over an underlying layer of molybdenum silicon oxynitride;

a first pattern portion generated by conventional photolithographic processing;

a second pattern portion layer produced by direct transfer printing of said pattern onto and completing the pattern layer.

10. The phase shift photomask reticle of claim 9 wherein said first pattern portion is fabricated by a half tone process comprising:

exposing a photoresist layer by electron beam pattern lithography and developing said pattern;

etching of a chromium/chromium oxide layer through said photoresist mask;

etching of an underlying molybdenum silicon oxynitride layer through the photoresist-chromium pattern; and stripping of the photoresist mask.

11. The phase shift photomask reticle of claim 9 wherein said direct transfer of the photoresist pattern on to the first pattern portion is accomplished by printing the photoresist pattern from a printing plate to the surface by means of a printing platen.

12. The phase shift photomask reticle of claim 9 wherein the thickness of said underlying layer of molybdenum silicon oxynitride is $n\lambda$, where $\lambda$ is the wavelength of the radiation used in photoresist exposure employing said photomask and n is an integer number between 1 and 5.

* * * * *